(12) United States Patent
Nunotani et al.

(10) Patent No.: US 11,342,426 B2
(45) Date of Patent: May 24, 2022

(54) SEMICONDUCTOR DEVICE AND METHOD OF MANUFACTURING SAME

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Shinji Nunotani, Kanazawa (JP); Shinji Onzuka, Nonoichi (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 44 days.

(21) Appl. No.: 16/802,670

(22) Filed: Feb. 27, 2020

(65) Prior Publication Data

US 2021/0066130 A1 Mar. 4, 2021

(30) Foreign Application Priority Data

Sep. 4, 2019 (JP) .............................. JP2019-161250

(51) Int. Cl.
*H01L 29/41* (2006.01)
*H01L 21/784* (2006.01)
(Continued)

(52) U.S. Cl.
CPC ............ *H01L 29/41* (2013.01); *H01L 21/268* (2013.01); *H01L 21/26513* (2013.01);
(Continued)

(58) Field of Classification Search
CPC ....... H01L 21/78; H01L 21/782; H01L 21/82; H01L 21/784; H01L 21/268;
(Continued)

(56) References Cited

U.S. PATENT DOCUMENTS 3,838,501 A * 10/1974 Umbaugh ............... H01L 24/80
438/113
6,271,102 B1 * 8/2001 Brouillette ........... B23D 59/002
257/E21.518
(Continued)

FOREIGN PATENT DOCUMENTS

JP 05-102300 A 4/1993
JP 2004-111606 A 4/2004

*Primary Examiner* — Eduardo A Rodela
(74) *Attorney, Agent, or Firm* — Oblon, McClelland, Maier & Neustadt, L.L.P.

(57) ABSTRACT

A semiconductor device includes a semiconductor part, first and second electrodes. The semiconductor part is provided between the first and second electrodes. A method of manufacturing the device includes forming the first electrode covering a back surface of a wafer after the second electrode is formed on a front surface of the wafer; forming a first groove by selectively removing the first electrode; and dividing the wafer by forming a second groove at the front surface side. The wafer includes a region to be the semiconductor part; and the first and second grooves are provided along a periphery of the region. The first groove is in communication with the first groove. The second groove has a width in a direction along the front surface of the wafer, the width of the first groove being narrower than a width of the first groove in the same direction.

4 Claims, 8 Drawing Sheets

(51) Int. Cl.
*H01L 21/268* (2006.01)
*H01L 21/306* (2006.01)
*H01L 21/304* (2006.01)
*H01L 21/3065* (2006.01)
*H01L 29/417* (2006.01)
*H01L 29/868* (2006.01)
*H01L 29/872* (2006.01)
*H01L 21/265* (2006.01)
*H01L 29/45* (2006.01)
*H01L 29/78* (2006.01)
*H01L 29/739* (2006.01)
*H01L 21/683* (2006.01)
*H01L 21/283* (2006.01)
*H01L 29/861* (2006.01)

(52) U.S. Cl.
CPC ........ *H01L 21/283* (2013.01); *H01L 21/3043* (2013.01); *H01L 21/3065* (2013.01); *H01L 21/30604* (2013.01); *H01L 21/6835* (2013.01); *H01L 21/784* (2013.01); *H01L 29/417* (2013.01); *H01L 29/45* (2013.01); *H01L 29/7397* (2013.01); *H01L 29/7813* (2013.01); *H01L 29/861* (2013.01); *H01L 29/868* (2013.01); *H01L 29/872* (2013.01); *H01L 2221/68327* (2013.01)

(58) Field of Classification Search
CPC . H01L 21/30604; H01L 21/302; H01L 21/30; H01L 21/304; H01L 21/3043; H01L 21/3065; H01L 21/283; H01L 21/461; H01L 21/465; H01L 29/417; H01L 2924/37001; H01L 21/02021; H01L 29/41; H01L 29/861
See application file for complete search history.

(56) References Cited

U.S. PATENT DOCUMENTS

| | | | | |
|---|---|---|---|---|
| 7,214,568 | B2* | 5/2007 | Brennan | H01L 21/30608 257/E21.223 |
| 2006/0223199 | A1* | 10/2006 | Ando | H01L 21/76898 438/3 |
| 2013/0295729 | A1* | 11/2013 | Nakazawa | H01L 29/0661 438/135 |
| 2014/0225126 | A1* | 8/2014 | Aketa | H01L 21/02529 257/77 |
| 2016/0276306 | A1* | 9/2016 | Kamphuis | H01L 21/304 |
| 2017/0084490 | A1* | 3/2017 | Bacquian | H01L 29/06 |
| 2017/0256453 | A1* | 9/2017 | Yada | H01L 25/0655 |
| 2017/0316998 | A1* | 11/2017 | Marutani | H01L 21/82 |
| 2018/0204786 | A1* | 7/2018 | Rodriguez | H01L 21/78 |

* cited by examiner

SEMICONDUCTOR DEVICE AND METHOD OF MANUFACTURING SAME

CROSS-REFERENCE TO RELATED APPLICATIONS

This application is based upon and claims the benefit of priority from Japanese Patent Application No. 2019-161250, filed on Sep. 4, 2019; the entire contents of which are incorporated herein by reference.

FIELD

Embodiments relate to a semiconductor device and a method of manufacturing the same.

BACKGROUND

In a manufacturing process of a semiconductor device, the wafer is often cut mechanically into a plurality of semiconductor chips using, for example, a dicing saw. Some of the semiconductor chips cut by such a method, however, may include a cutting burr or a cracked edge, thereby reducing the manufacturing yield.

DETAILED DESCRIPTION

Figure 1A:
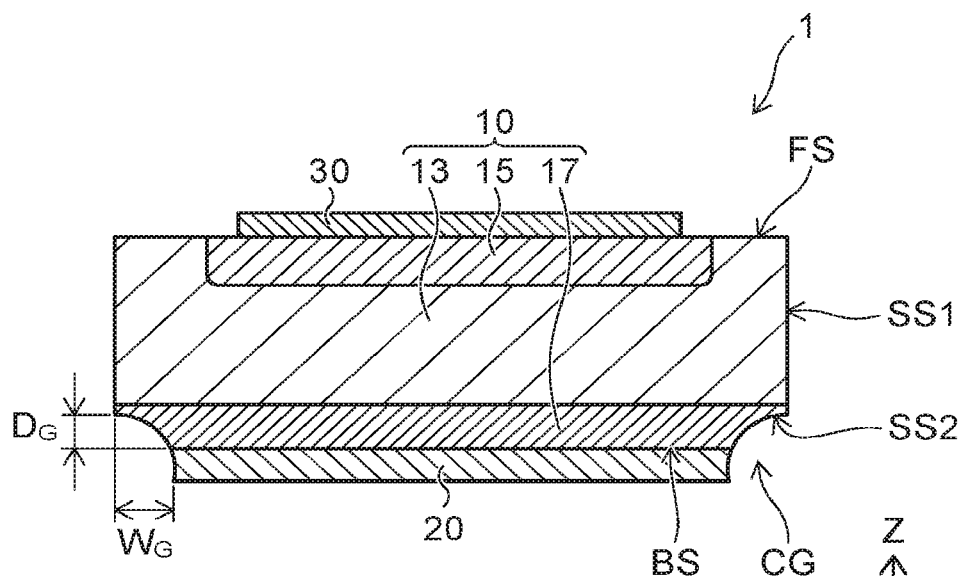
FIGS. 1A and 1B are schematic views showing a semiconductor device according to an embodiment.

According to one embodiment, a semiconductor device includes a semiconductor part, a first electrode provided on the semiconductor part and a second electrode. The semiconductor part is provided between the first and second electrodes. A method of manufacturing the semiconductor device includes forming the first electrode covering a back surface of a wafer after the second electrode is formed on a front surface of the wafer; forming a first groove by selectively removing the first electrode; and dividing the wafer by forming a second groove at the front surface side. The wafer includes a region to be the semiconductor part. The first and second grooves are provided along a periphery of the region to be the semiconductor part. The first groove includes a portion provided in the wafer. The second groove is in communication with the first groove. The second groove has a width in a direction along the front surface of the wafer, the width of the first groove being narrower than a width of the first groove in the same direction.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
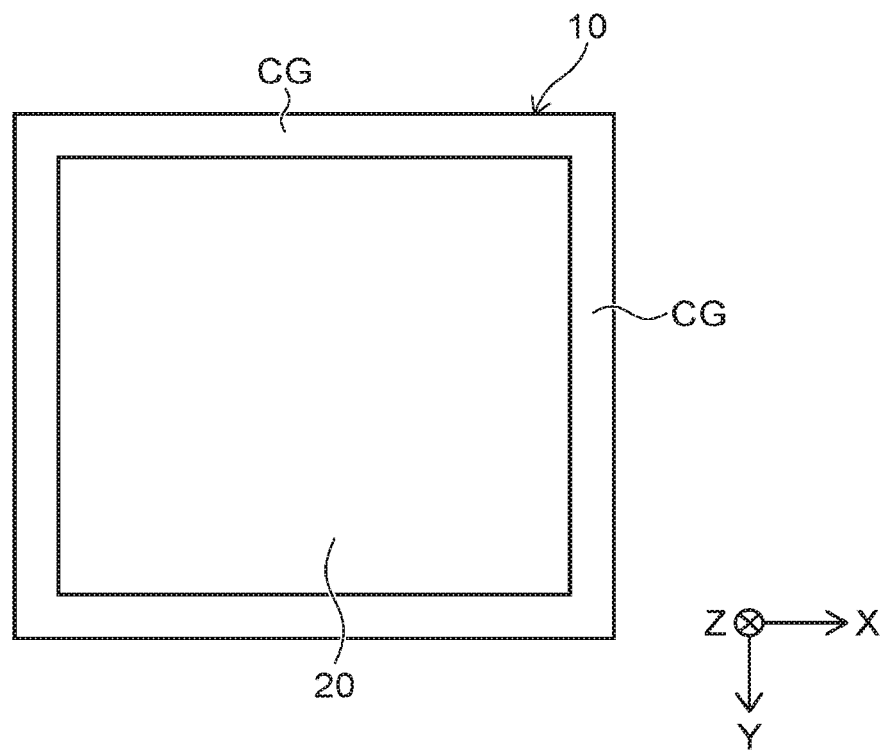

FIGS. 1A and 1B are schematic views showing a semiconductor device 1 according to an embodiment. FIG. 1A is a schematic cross-sectional view showing a structure of the semiconductor device 1. FIG. 1B is a schematic plan view showing a back surface of the semiconductor device 1. The semiconductor device 1 is, for example, a PIN diode.

As shown in FIG. 1A, the semiconductor device 1 includes, for example, a semiconductor part 10, a first electrode 20, and a second electrode 30. The semiconductor part 10 is, for example, silicon. The first electrode 20 is, for example, a cathode electrode. The second electrode 30 is, for example, an anode electrode.

The semiconductor part 10 includes, for example, a first semiconductor layer 13, a second semiconductor layer 15, and a third semiconductor layer 17. The first semiconductor layer 13 is, for example, an intrinsic layer. The second semiconductor layer 15 is, for example, a p-type anode layer, and the third semiconductor layer 17 is, for example, an n-type cathode layer.

The second semiconductor layer 15 is provided between the first semiconductor layer 13 and the second electrode 30. The third semiconductor layer 17 is provided between the first semiconductor layer 13 and the first electrode 20. The third semiconductor layer 17 includes an n-type impurity with a concentration higher than a concentration of the n-type impurity in the first semiconductor layer 13.

The first electrode 20 covers the back surface BS of the semiconductor part 10 and is electrically connected to the third semiconductor layer 17. The second electrode 20 is provided on the front surface FS of the semiconductor part 10. The second electrode 20 is electrically connected to the second semiconductor layer 15.

The semiconductor part 10 has a first side surface SS1 and a second side surface SS2. The first side surface SS1 is linked to the front surface FS. The second side surface SS2 is linked to the first side surface 551 and the back surface BS. The second side surface SS2 is a portion of the groove CG (see FIG. 4A) that is provided at the back surface BS side of the semiconductor part 10. The second side surface SS2 includes a portion inclined to the first side surface SS1 and the back surface BS.

The groove CG has, for example, a width $W_G$ in a direction along the back surface BS (e.g., X-direction) and a depth $D_G$ in a direction along the first side surface SS1 (e.g., Z-direction). For example, the groove CG has the depth $D_G$ smaller than the width $W_G$ ($W_G > D_G$).

As shown in FIG. 1B, the groove CG is provided along a periphery of the semiconductor part 10. The groove CG extends, for example, in the X-direction and the Y-direction.

When the semiconductor device 1 is a Schottky barrier diode (SBD), the second semiconductor layer 15 (p-type anode layer) is not provided, and the second electrode 30 directly contacts, for example, the first semiconductor layer 13.

Hereinafter, a method of manufacturing the semiconductor device 1 will be described with reference to FIGS. 2A to 5C. FIGS. 2A to 5C are schematic cross-sectional views showing the manufacturing process of the semiconductor device 1 according to the embodiment.

Figure 2A:
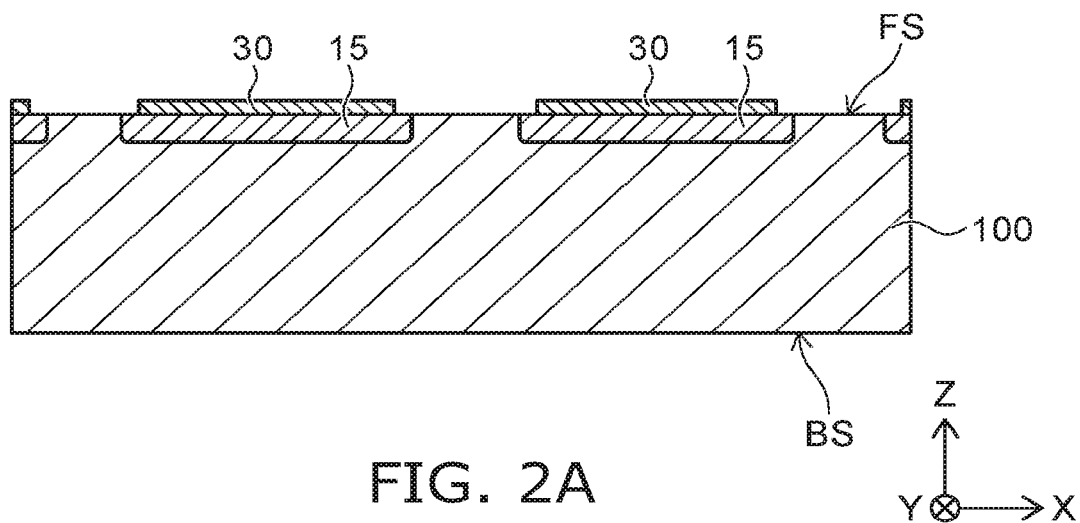
FIGS. 2A to 5C are schematic cross-sectional views showing a manufacturing process of the semiconductor device according to the embodiment.

As shown in FIG. 2A, the second electrode 30 is selectively formed on the second semiconductor layer 15 after the second semiconductor layer 15 is formed at the front surface FS side of the semiconductor wafer 100. The semiconductor wafer 100 is, for example, an n-type silicon wafer with a low impurity concentration. The second semiconductor layer 15 is formed by selectively ion-implanting a p-type impurity such as boron (B) into the semiconductor wafer 100. The second electrode 30 is electrically connected to the second semiconductor layer 15. The second electrode 30 includes, for example, aluminum, tungsten, titanium, or the like.

Figure 2B:
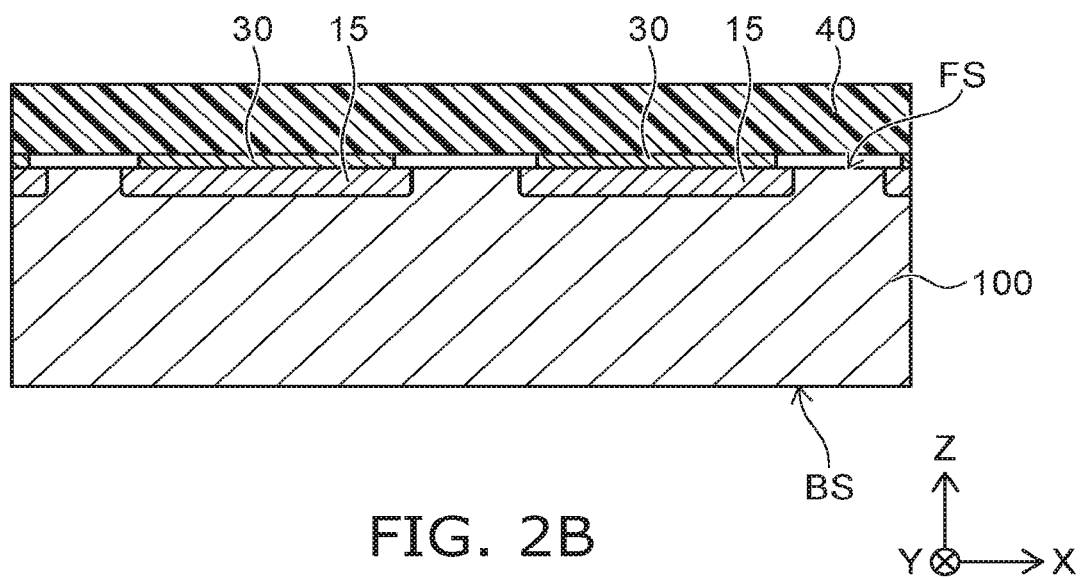

As shown in FIG. 2B, the support member 40 is attached to the front surface FS side of the semiconductor wafer 100. The support member 40 is, for example, a surface protection sheet. The support member 40 is provided to cover and protect the second electrode 30.

Figure 3A:
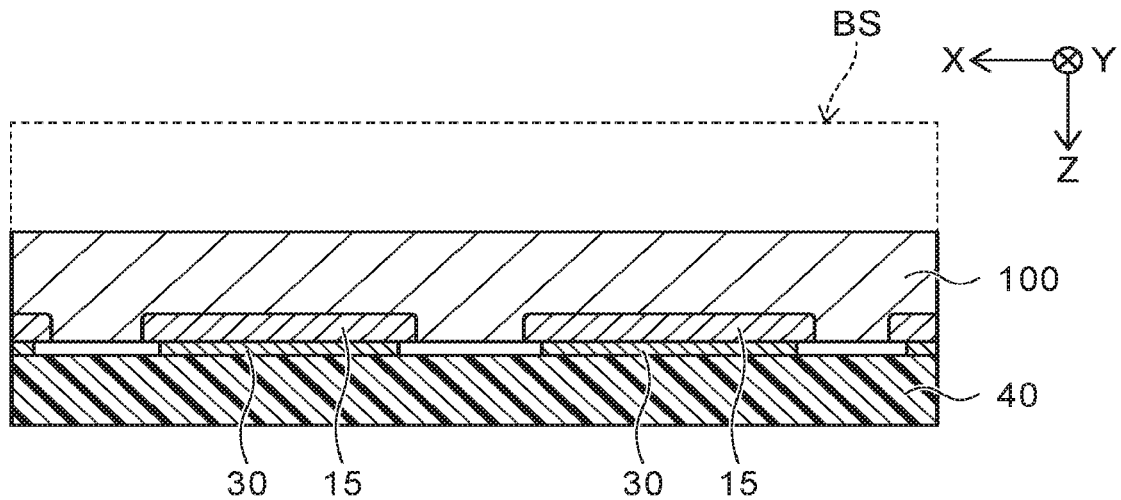

As shown in FIG. 3A, the semiconductor wafer 100 is thinned to have a predetermined thickness by grinding, polishing, or etching the back surface BS side. The back surface side of semiconductor wafer 100 is removed leaving a portion which is to be the semiconductor part 10.

Figure 3B:
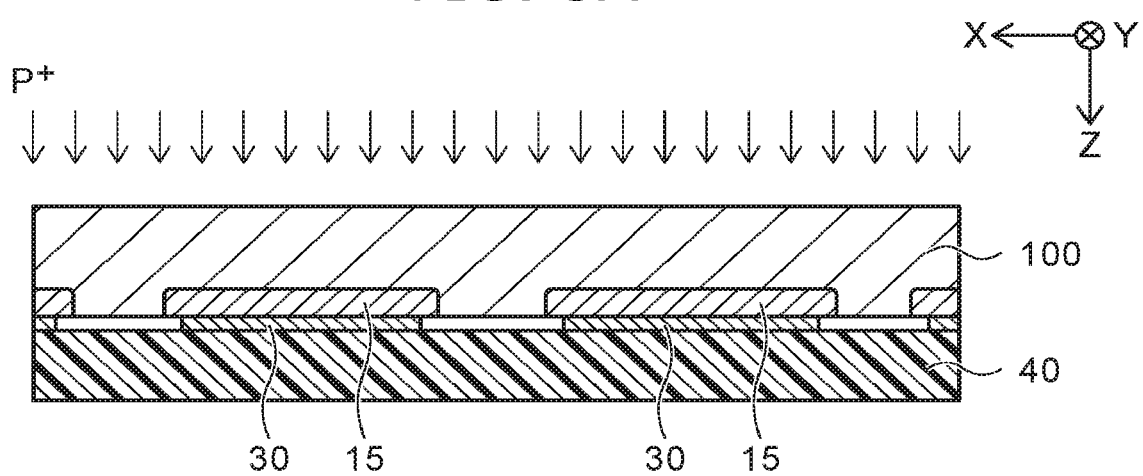

As shown in FIG. 3B, the n-type impurity such as phosphorus is ion-implanted into the semiconductor wafer 100 at the back surface BS side.

Figure 3C:
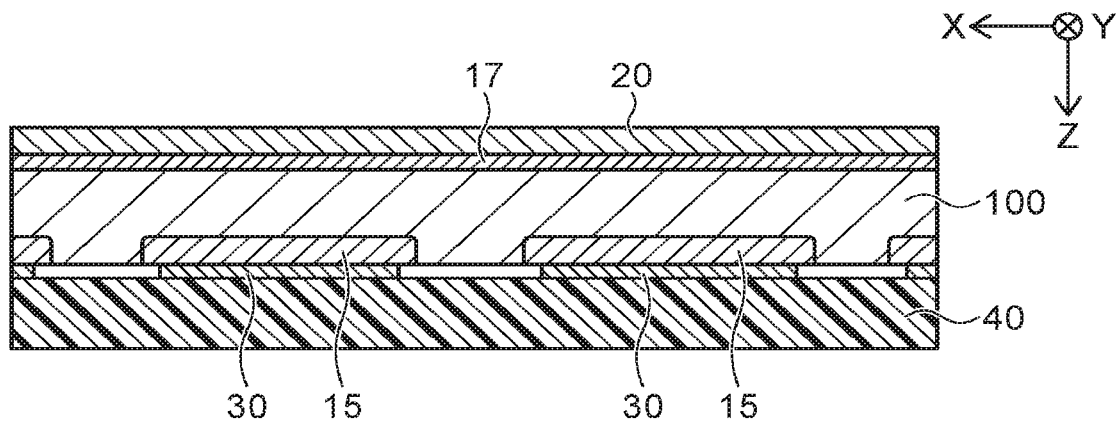

As shown in FIG. 3C, the first electrode 20 is formed to cover the back surface BS of the semiconductor wafer 100 after the third semiconductor layer 17 is formed. The third semiconductor layer 17 is formed by activating the n-type impurity ion-implanted into the semiconductor wafer 100 using, for example, a laser annealing method. The first electrode 20 includes, for example, at least one element of Al, Ni, Ti, Au, Ag, Pt, Cu and Sn.

Figure 4A:
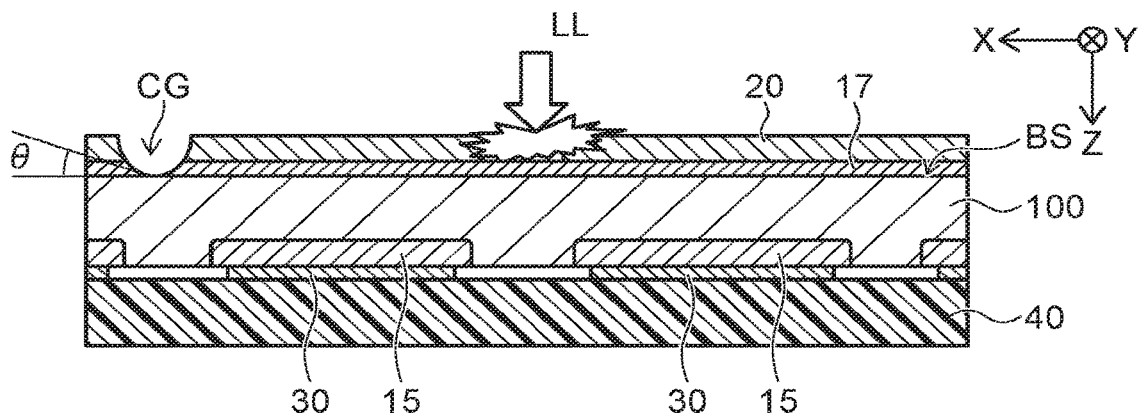

As shown in FIG. 4A, the groove CG is formed by irradiating the back surface BS of the semiconductor wafer 100 with laser light. The groove CG is formed by selectively removing the first electrode 20 and then, by selectively removing a part of the semiconductor wafer 100. The groove CG includes a portion formed in the semiconductor wafer 100, and the portion of the groove CG has a depth $D_G$ (see FIG. 1A) of several micrometers, for example. The groove CG may be formed by selectively etching the semiconductor wafer 100 at the back surface BS side using, for example, plasma etching, RIE (Reactive Ion Etching), CDE (Chemical Dry Etching), or wet etching.

For example, grooves CG are formed to extend in the X-direction and the Y-direction and intersect each other in the lattice configuration. For example, the grooves CG are formed along the periphery of the semiconductor part 10. The laser beam irradiation is controlled to be provided one time or a plurality of times at the same position.

Moreover, the laser beam is focused to be a laser spot with a predetermined diameter, in which the energy intensity is high at the center and decreases toward the outside thereof. Thus, the groove CG is formed so as to have the inner wall inclined upward from the bottom surface thereof. For example, the inclined angle θ of the inner wall to the bottom surface is preferably 5 degrees or less, but there may be a case where the inclined angle θ is more than 5 degrees.

Figure 4B:
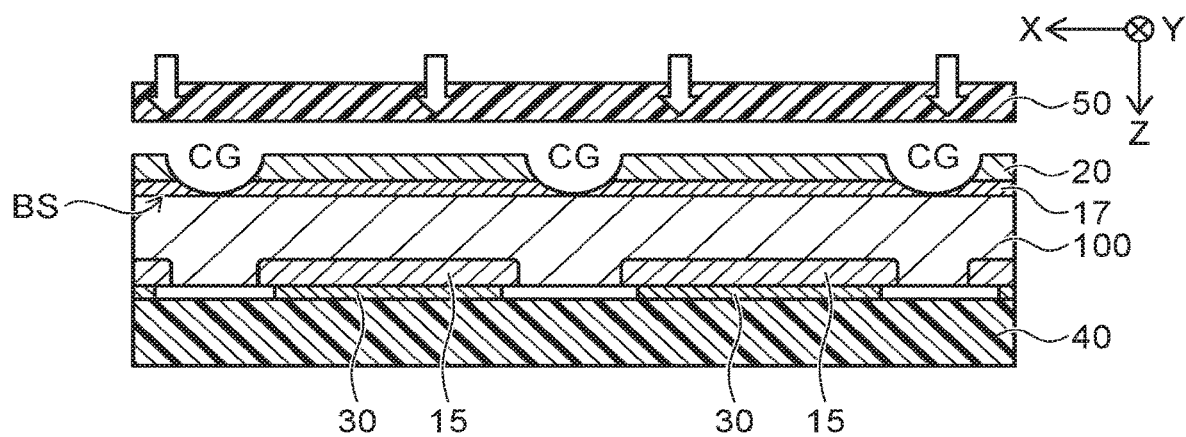

As shown in FIG. 4B, for example, a dicing sheet 50 is attached to the back surface BS side of the semiconductor wafer 100.

Figure 4C:
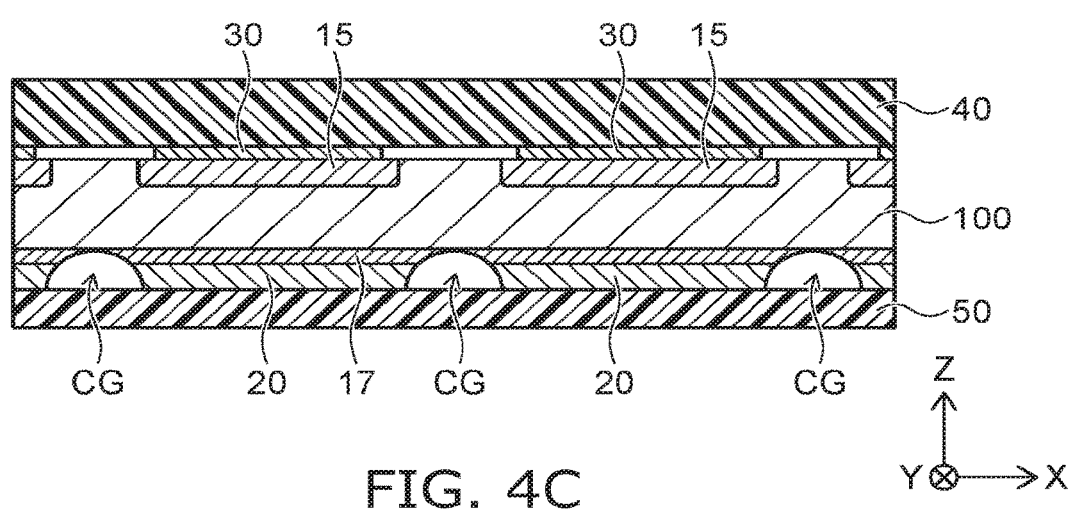

FIG. 4C shows the semiconductor wafer 100 after the dicing sheet 50 is attached, which is the upside-down view of FIG. 4B.

Figure 5A:
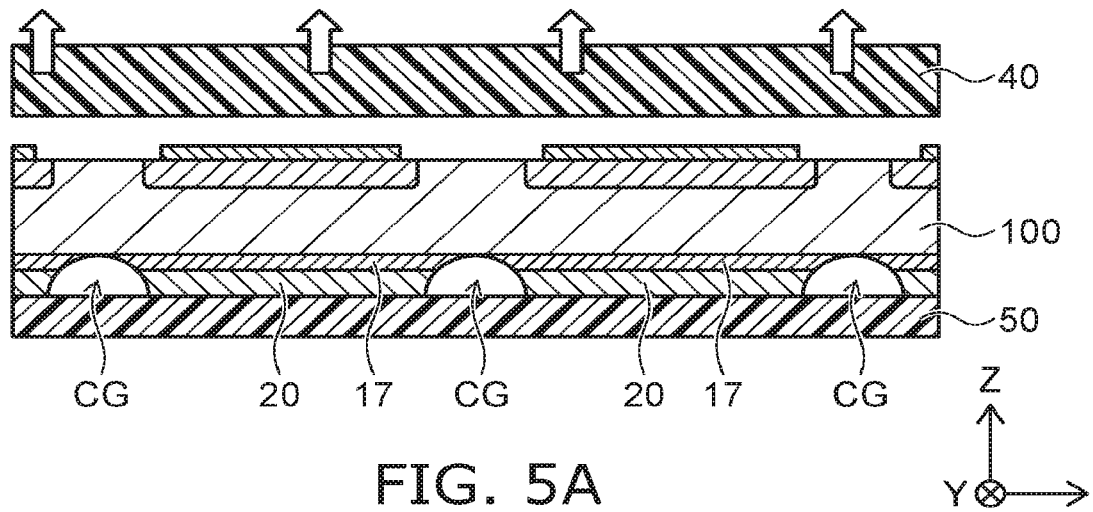
Figure 5B:
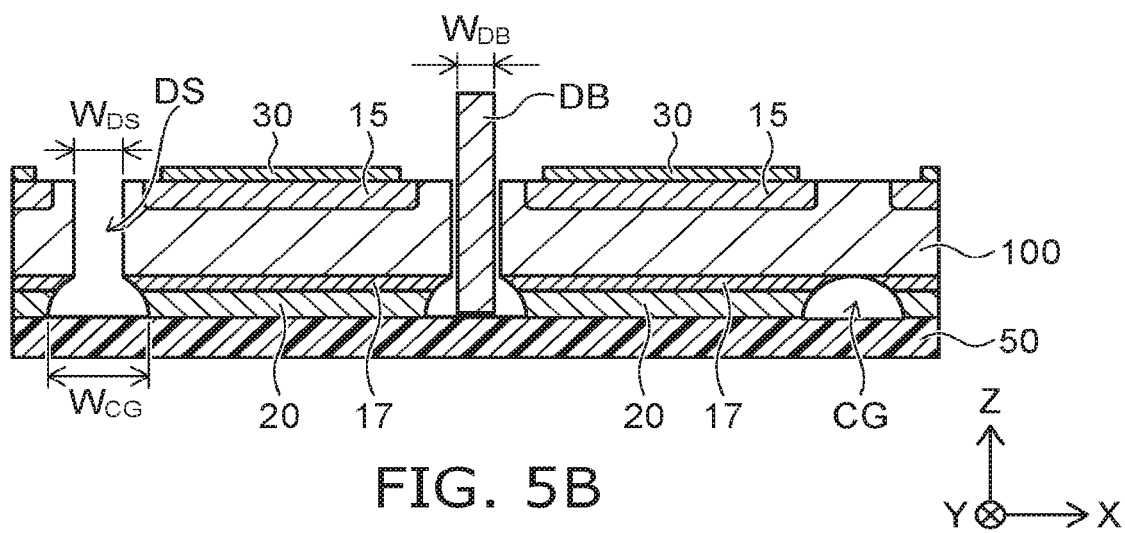

As shown in FIG. 5A, the support member 40 is removed from the front surface of the semiconductor wafer 100. Subsequently, as shown in FIG. 5B, a new groove that is in communication with the groove CG is formed. The groove (hereinafter referred to as dicing space DS) is formed such that the width $W_{DS}$ thereof in the X-direction is narrower than the width $W_{CG}$ of the groove CG in the X-direction.

The dicing space DS is formed, for example, by cutting the semiconductor wafer 100 using a dicing blade DB. The width $W_{DB}$ of the dicing blade DB used for forming the dicing space DS is narrower than the width $W_{CG}$ of the groove CG.

Figure 5C:
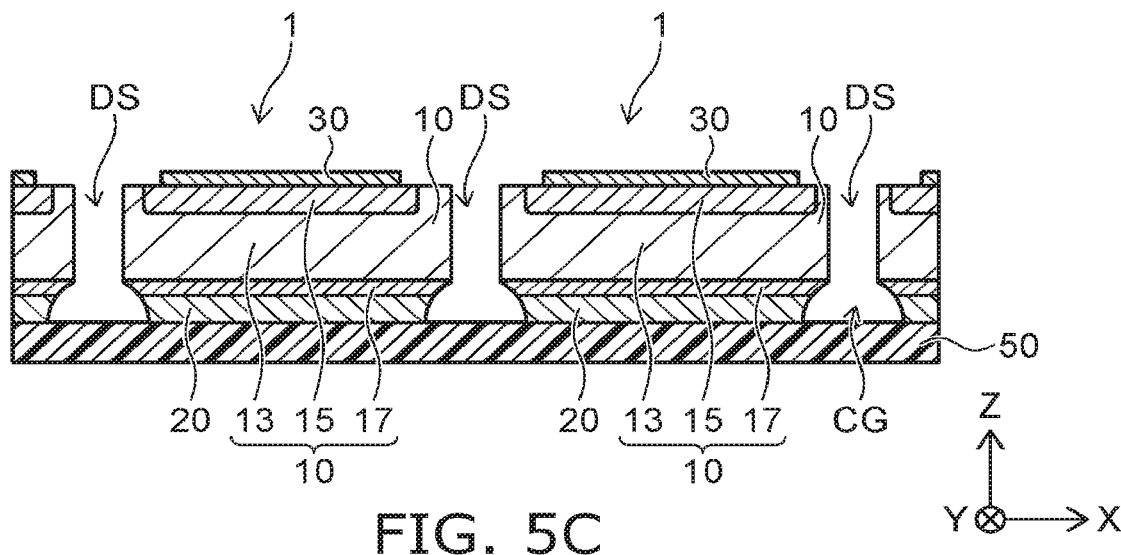

As shown in FIG. 5C, the semiconductor wafer 100 is cut into a plurality of chips of semiconductor devices 1. The dicing space DS is formed in the X-direction and the Y-direction along the periphery of the semiconductor part 10.

Figure 6A:
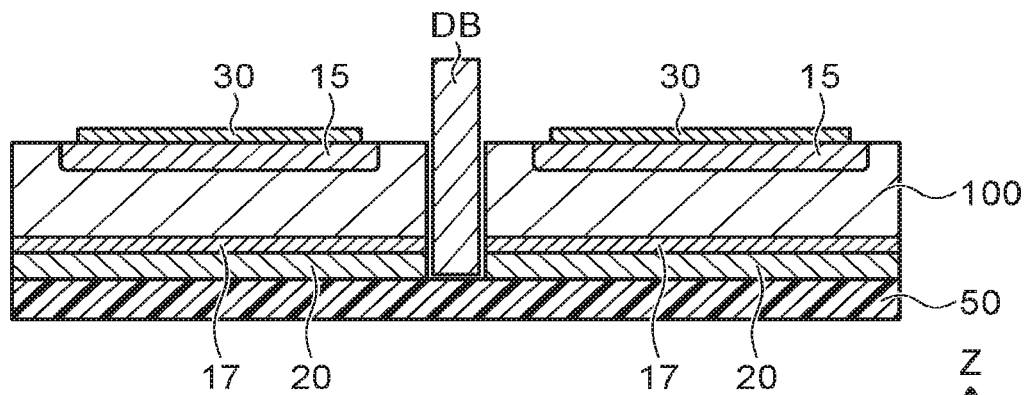
FIGS. 6A to 6C are schematic cross-sectional views showing a manufacturing process of a semiconductor device according to a comparative example.
Figure 6B:
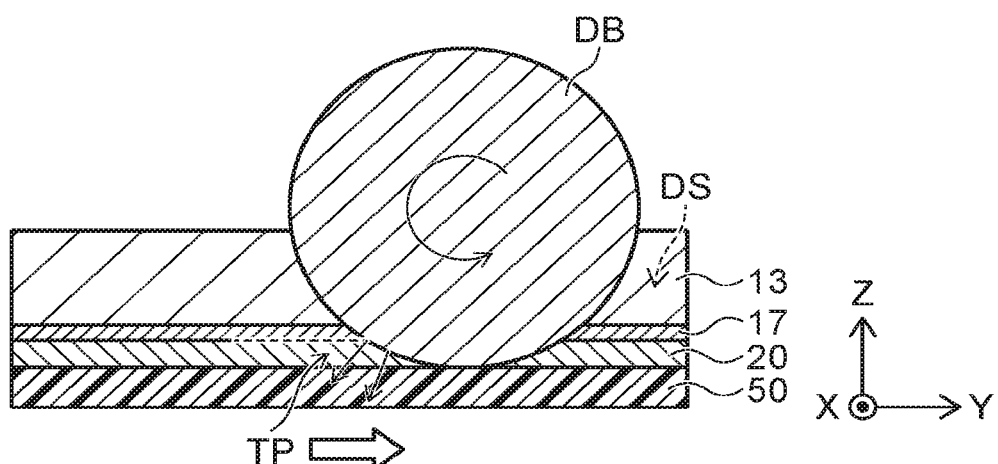
Figure 6C:
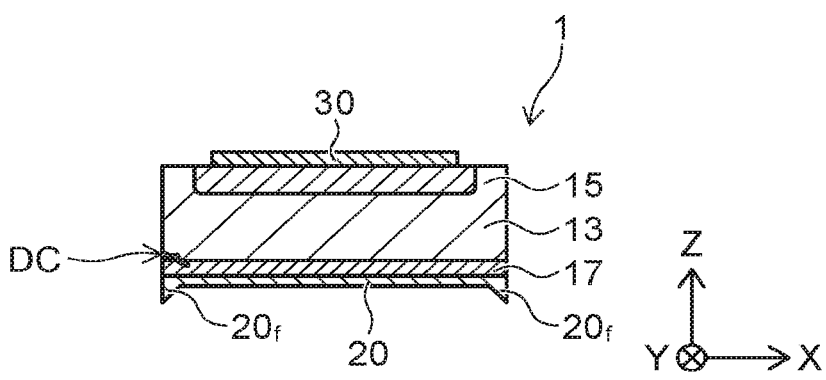

FIGS. 6A to 6C are schematic cross-sectional views showing a manufacturing process of the semiconductor device 1 according to a comparative example. FIGS. 6A and 6B are schematic views showing the dividing process of the semiconductor wafer 100 using the dicing blade DB. FIG. 6C is a cross sectional view showing the semiconductor device 1 which is formed into a chip using the manufacturing method according to the comparative example.

As shown in FIG. 6A, the groove CG is not formed in the back surface BS of the semiconductor wafer 100 in this example. Therefore, the first electrode 20 is also divided by the dicing blade DB.

As shown in FIG. 6B, the semiconductor wafer 100 is moved in the Y-direction, for example, while rotating the dicing blade DB. Then, a thin portion TP grounded along the periphery of the dicing blade DB is formed at the back surface side of the semiconductor wafer 100. The thin portion TP is pressed toward the dicing sheet 50 by the dicing blade DB, and thereby the cracked edge so called chipping may be easily formed.

As shown in FIG. 6C, the semiconductor device 1 may include a dicing crack DC at the back surface side. Moreover, the first electrode 20 may be cut off with a cutting burr $20_f$, for example. The cutting burr $20_f$ is formed by, for example, the metal entanglement while the dicing blade DB cuts off the first electrode 20.

Such defects, for example, reduce the strength of the semiconductor device 1 and contribute to a failure such as a chip breakage. The cutting burr $20_f$ provides an air bubble in the solder material at the time of chip bonding, and thereby, contributes to the void formation in the solder. When the cutting burr $20_f$ is separated from the semiconductor device 1 and becomes a dust, the cleanness may be lowered in a manufacturing environment.

In the manufacturing method according to the embodiment, it is possible to reduce the thin portion TP by forming the groove CG at the back surface side of the semiconductor wafer 100, thereby reducing the chipping and cracking while grinding. Moreover, the first electrode 20 is not cut off using the dicing blade DB, and thus, the cutting burr $20_f$ is not generated.

Figure 7A:
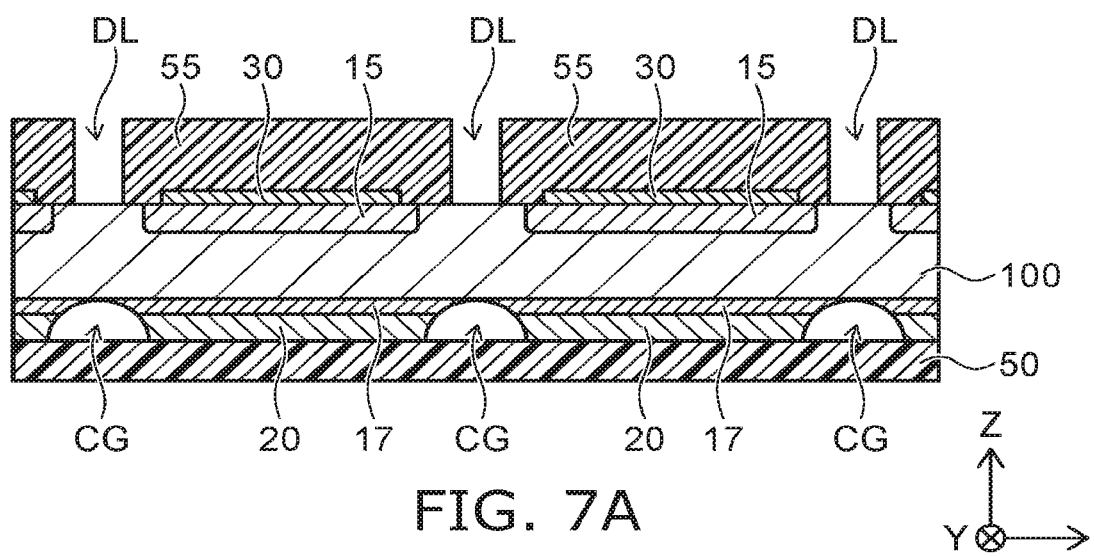
FIGS. 7A to 7C are schematic cross-sectional views showing a manufacturing process of a semiconductor device according to a modification of the embodiment.
Figure 7B:
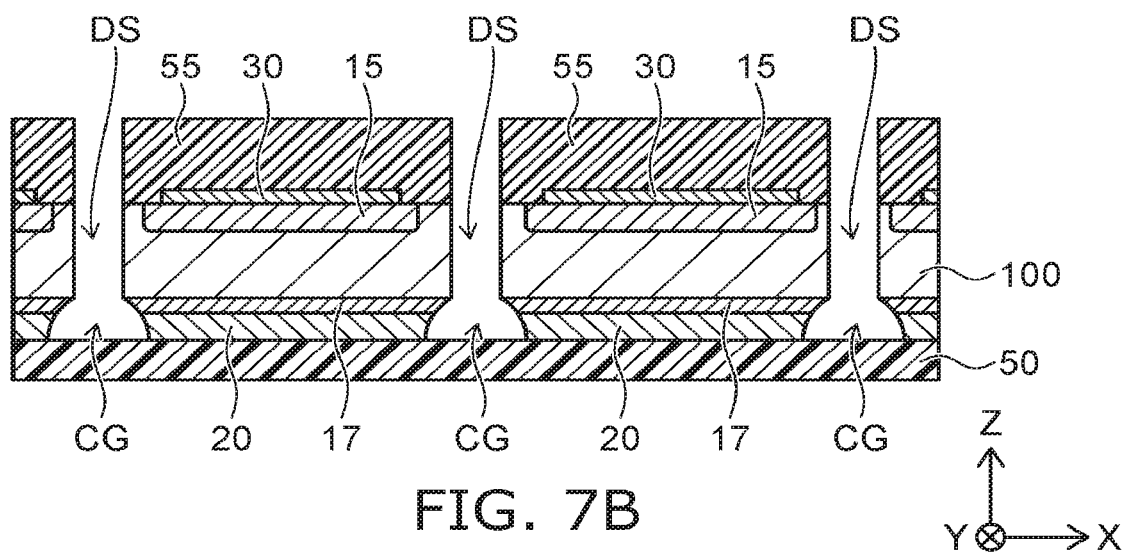
Figure 7C:
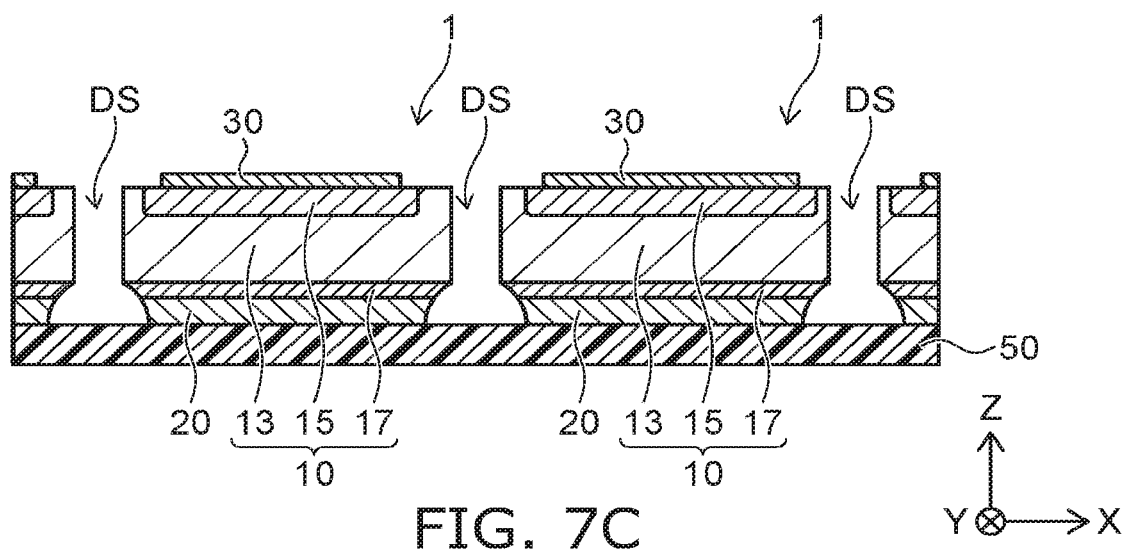

Hereinafter, a manufacturing method according to a modification of the embodiment will be described with reference to FIGS. 7A to 7C. FIGS. 7A to 7C are schematic cross-sectional views showing the manufacturing process of the semiconductor device according to the modification of the embodiment.

As shown in FIG. 7A, after the support member 40 is removed from the front surface of the semiconductor wafer 100 (see FIG. 5A), an etching mask 55 is formed thereon. The etching mask 55 is formed on the front surface of the semiconductor wafer 100 and includes an opening DL along the periphery of the region to be the semiconductor part 10.

As shown in FIG. 7B, the dicing space DS is formed by selectively removing the semiconductor wafer 100 using, for example, a dry etching method. The dicing space DS is formed to be in communication with the groove CG.

As shown in FIG. 7C, the semiconductor device 1 is achieved with the chip form by removing the etching mask 55.

In this example, the first electrode 20 is also selectively removed by forming the groove CG at the back surface side of the semiconductor wafer 100. Thereby, it is possible to divide the semiconductor wafer 100 into a plurality chips without removing the first electrode 20 during the dry etching, and thus, the dry etching is easily performed. Moreover, it is possible to prevent the solder from creeping upward by providing the groove CG at the back surface side of the semiconductor device 1.

Figure 8A:
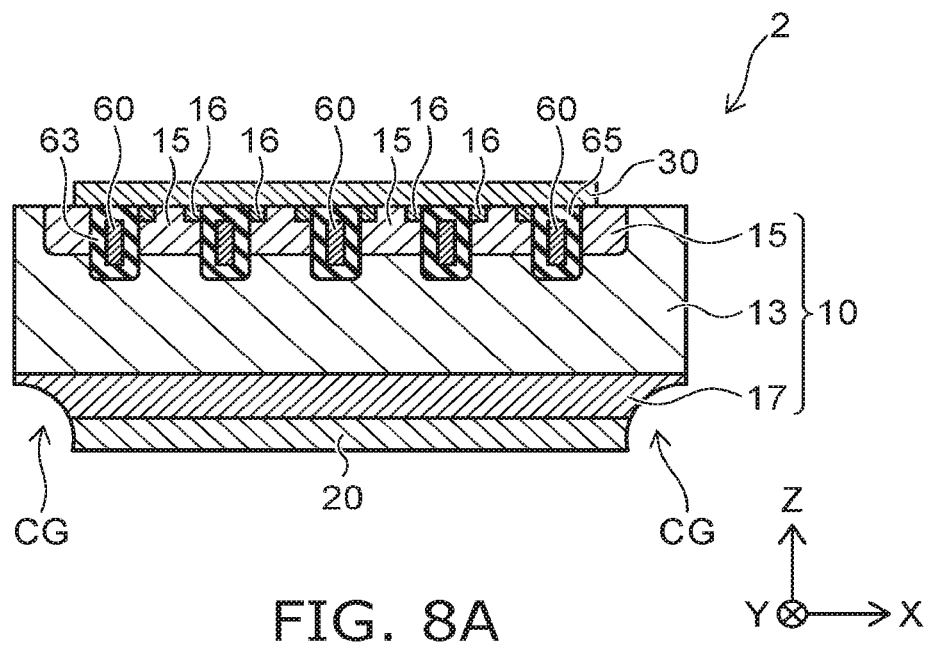
FIGS. 8A and 8B are schematic cross-sectional views showing semiconductor devices according to modifications of the embodiment.
Figure 8B:
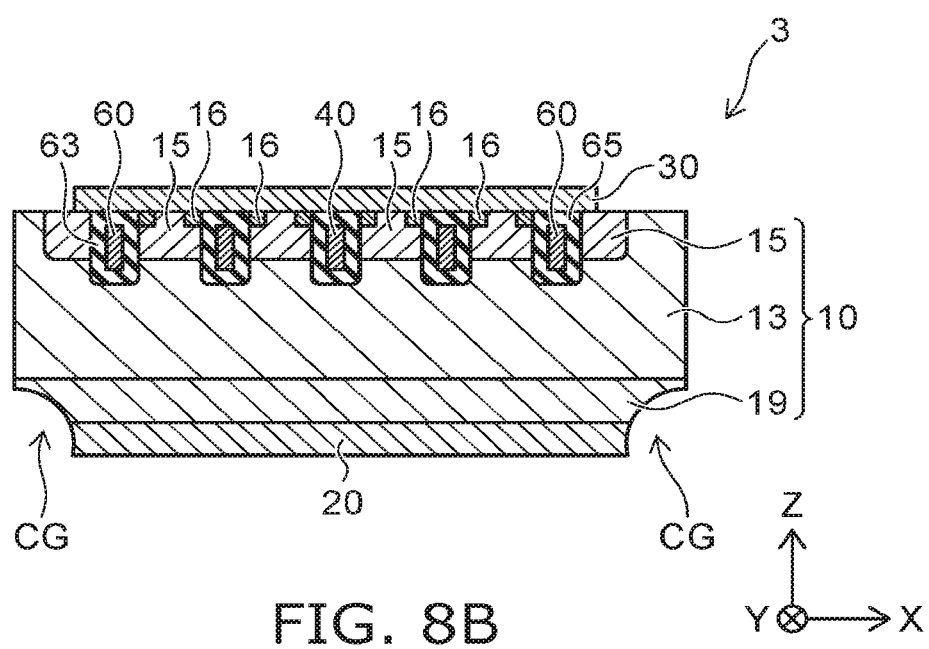

FIGS. 8A and 8B are schematic cross-sectional views showing semiconductor devices 2 and 3 according to modifications of the embodiment. The semiconductor devices 2 and 3 shown in FIGS. 8A and 8B are a MOSFETs and an IGBT (Insulated Gate Bipolar Transistors), respectively. The semiconductor devices 2 and 3 each have a groove CG provided at the back surface side of the semiconductor part 10.

In the semiconductor device 2 shown in FIG. 8A, the first electrode 20 is, for example, a drain electrode, and the second electrode 30 is, for example, a source electrode. The first semiconductor layer 13 is, for example, an n-type drift layer. The second semiconductor layer 15 is, for example, a p-type diffusion layer, and the third semiconductor layer 17 is an n-type drain layer.

The semiconductor part 10 in the semiconductor device 2 further includes a fourth semiconductor layer 16. The fourth semiconductor layer 16 is, for example, an n-type source layer, and is selectively provided between the second semiconductor layer 15 and the second electrode 30. For example, the fourth semiconductor layer 16 includes an n-type impurity with a concentration higher than the concentration of the n-type impurity in the first semiconductor layer 13. The fourth semiconductor layer is electrically connected to the second electrode 30.

The semiconductor device 2 further includes a control electrode 60. The control electrode 60 is provided in a trench at the front surface side of the semiconductor part 10, and is provided between the semiconductor part 10 and the second electrode 30. The control electrode 60 is electrically insulated from the semiconductor part 10 by an insulating film 63. The control electrode 60 is electrically insulated from the second electrode 30 by an insulating film 65.

In the semiconductor device 3 shown in FIG. 8B, the first electrode 20 is, for example, a collector electrode, and the second electrode 30 is, for example, an emitter electrode. The first semiconductor layer 13 is, for example, an n-type base layer. The second semiconductor layer 15 is, for example, a p-type base layer, and the third semiconductor layer 19 is a p-type collector layer.

The semiconductor part 10 in the semiconductor device 3 further includes a fourth semiconductor layer 16. The fourth semiconductor layer 16 is, for example, an n-type emitter layer, and is selectively provided between the second semiconductor layer 15 and the second electrode 30. For example, the fourth semiconductor layer 16 includes an n-type impurity with a concentration higher than a concentration of the n-type impurity in the first semiconductor layer 13, and is electrically connected to the second electrode 30.

In these examples, it is also possible in the manufacturing process to prevent the chipping and cracking by providing the groove CG at the back surface side of the semiconductor part 10. Moreover, the cutting burr $20_f$ (refer FIG. 6C) is also prevented from being produced at the first electrode 20.

As described above, some examples have been presented, but the embodiment is not limited thereto. For example, in place of the laser irradiation, the groove CG may be formed in the semiconductor wafer using selective etching.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a semiconductor part;
a first electrode provided on a back surface of the semiconductor part; and
a second electrode provided on a front surface of the semiconductor part,
the semiconductor part including a first side surface and a second side surface, the first side surface linking the front surface and the second side surface, the second side surface linking the back surface and the first side surface, the second side surface including a portion inclined to the first side surface and the back-surface,
wherein the second side surface provides a curved chamfer that has a first width in a horizontal direction and a second width in a vertical direction, the horizontal direction being directed along the hack surface of the semiconductor part, the vertical direction being directed from the back surface to the front surface of the semiconductor part, the first width being larger than the second width, and the second electrode is not provided on the second side surface.

2. The device according to claim 1, wherein
the semiconductor part includes a first semiconductor layer of a first conductivity type and a second semiconductor layer of a second conductivity type; and
the second semiconductor layer is provided between the first semiconductor layer and the second electrode, the second semiconductor layer being electrically connected to the second electrode.

3. The device according to claim 1, wherein
the back surface has an area smaller than an area of the front surface.

4. The device according to claim 1, wherein
The back surface has a periphery positioned inside a periphery of the front surface when viewing the back surface in a direction from the hack surface to the front surface.

* * * * *